(12) United States Patent
Wu et al.

(10) Patent No.: US 12,094,899 B2
(45) Date of Patent: Sep. 17, 2024

(54) METASURFACES FOR HIGH-EFFICIENT IR PHOTODETECTORS

(71) Applicant: UNIVERSITY OF SOUTHERN CALIFORNIA, Los Angeles, CA (US)

(72) Inventors: Wei Wu, Los Angeles, CA (US); Tse-Hsien Ou, Los Angeles, CA (US); Yunxiang Wang, Los Angeles, CA (US); Hao Yang, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 380 days.

(21) Appl. No.: 17/333,847

(22) Filed: May 28, 2021

(65) Prior Publication Data

US 2021/0375960 A1 Dec. 2, 2021

Related U.S. Application Data

(60) Provisional application No. 63/031,165, filed on May 28, 2020.

(51) Int. Cl.
*H01L 27/146* (2006.01)

(52) U.S. Cl.
CPC .... *H01L 27/1462* (2013.01); *H01L 27/14685* (2013.01)

(58) Field of Classification Search
CPC ........... H01L 27/1462; H01L 27/14685; H01L 27/14629; H01L 31/02165; H01L 31/02327; H01L 31/02366; G02B 5/208
See application file for complete search history.

(56) References Cited

U.S. PATENT DOCUMENTS

| | | | |
|---|---|---|---|
| 2018/0216797 A1* | 8/2018 | Khorasaninejad | F21V 5/10 |
| 2018/0252857 A1* | 9/2018 | Glik | G02B 27/0172 |
| 2019/0086683 A1* | 3/2019 | Aieta | H01Q 15/10 |
| 2019/0178714 A1* | 6/2019 | Faraji-Dana | G01J 3/0259 |
| 2019/0178720 A1* | 6/2019 | Padilla | G02B 1/002 |

OTHER PUBLICATIONS

Wang, Y. et al., "Inverse design of angle-sensing metasurface by particle swarm optimization", EIPBN 2019, Minneapolis, MN, May 2019, 21 pgs.

* cited by examiner

*Primary Examiner* — Jonathan Han
(74) *Attorney, Agent, or Firm* — Brooks Kushman P.C.

(57) ABSTRACT

A semiconductor-based sensor with enhanced light absorption, and in particular, enhanced infrared light absorption includes a semiconductor light sensor element and a patterned spatially inhomogeneous dielectric layer disposed over the semiconductor light sensor element. Characteristically, spatial inhomogeneity of the patterned spatially inhomogeneous dielectric layer is optimized to provide a maximized electric field in the semiconductor light sensor element such light absorption is enhanced.

14 Claims, 14 Drawing Sheets
(4 of 14 Drawing Sheet(s) Filed in Color)

METASURFACES FOR HIGH-EFFICIENT IR PHOTODETECTORS

CROSS-REFERENCE TO RELATED APPLICATIONS

This application claims the benefit of U.S. provisional application Ser. No. 63/031,165 filed May 28, 2020, the disclosure of which is hereby incorporated in its entirety by reference herein.

TECHNICAL FIELD

In at least one aspect, the present invention is related to IR detectors designs with improved efficiency.

BACKGROUND

Metasurfaces have shown extraordinary promise to achieve comprehensive control over the characteristics of light scattered, transmitted, and reflected from such surfaces. Metasurfaces can be viewed as artificially designed arrays of subwavelength optical scatterers, where each scatterer introduces abrupt changes to the phase, amplitude, or polarization of the reflected or transmitted electromagnetic waves. Therefore, metasurfaces offer the ability to control the wavefront of the scattered, transmitted, and reflected light, thereby creating new flat optics and ultrathin optoelectronic components. Metasurfaces have been used to demonstrate a number of low-profile optical components with important capabilities, including focusing, polarization control, and detection, holograms, and quantum light control.

Electric components such as CMOS sensors are consistently be reduced in size. In the case of light sensors, this size reduction raises issues regarding the ability to absorb sufficient light for detection.

Accordingly, there is a need to enhance the light absorption properties of light sensors, and in particular, the absorption of infrared light.

SUMMARY

In at least one aspect, the present invention provides metasurfaces design that enhances the light absorption light detectors, and in particular for IR photodetectors. FDTD simulation and optimization methods are applied to simulate the enhanced factor of light absorption when applying metasurfaces on top of the photodetector. The dimensions of the metasurface are optimized by using the optimization methods set forth below, thereby providing the highest possible light absorption enhancement for photodetectors (e.g., IR photodetectors).

In another aspect, a semiconductor-based sensor with enhanced light absorption is provided. The semiconductor-based sensor includes a semiconductor light sensor element and a patterned spatially inhomogeneous dielectric layer disposed over the semiconductor light sensor element. Characteristically, the spatial inhomogeneity of the patterned spatially inhomogeneous dielectric layer is optimized to increase (i.e., enhance) light absorption in the semiconductor light sensor element as compared to light absorption in the semiconductor light sensor element without the patterned spatially inhomogeneous dielectric layer.

In another aspect, a semiconductor-based sensor with enhanced light absorption is provided. The semiconductor-based sensor includes a semiconductor light sensor element and a patterned spatially inhomogeneous dielectric layer disposed over the semiconductor light sensor element. The patterned spatially inhomogeneous dielectric layer includes an array of cells. A first subset of the array of cells includes cells that have a first refractive index and a second subset of the array of cells includes cells that have a second refractive index. The patterned spatially inhomogeneity of the patterned spatially inhomogeneous dielectric layer is optimized with respect to a set of adjustable design parameters to increase light absorption in the semiconductor light sensor element as compared to light absorption in the semiconductor light sensor element without the patterned spatially inhomogeneous dielectric layer. Characteristically, the set of adjustable design parameters including cell lengths and cell widths.

In another aspect, a method for enhancing the light absorption of a semiconductor-based sensor is provided. The semiconductor-based sensor includes a patterned spatially inhomogeneous dielectric layer disposed over a semiconductor light sensor element. Characteristically, the patterned spatially inhomogeneous dielectric layer is defined by a plurality of adjustable design parameters. Therefore, the method incudes a step of receiving a set of optimized design parameters determined by simulating an amount absorbed by semiconductor-based sensor by a simulation method and optimizing the plurality of adjustable design parameters by an optimization method to enhance light absorption in the semiconductor light sensor element to form the set of optimized design parameters. The patterned spatially inhomogeneous dielectric layer is fabricated over the semiconductor light sensor element with the plurality of adjustable design parameters set to values that are within 20 percent of optimized design parameters in the set of optimized design parameters.

In another aspect, a nanostructure that can greatly enhance the 850 nm light absorption inside the silicon substrate is optimized. Lumerical FDTD and MEEP were used to simulate the light absorption for the nanostructure, and later on the optimization was used to figure out the optimized parameters of the nanostructure. Since MEEP can provide greater programming flexibility, MEEP was mainly used for simulation, and Lumerical FDTD was only used to double-check the simulation result. MEEP is a FDTD simulation software package for modeling electromagnetic systems.

Advantageously, applying a patterned dielectric layer on top of the CMOS IR photodetectors as a metasurface layer can largely enhance the light absorption of the IR photodetectors compared with the bare CMOS IR photodetectors. Therefore, the resolution of such an IR camera is enhanced. The pattern of the dielectric layer is designed and optimized by applying the optimization method that ensured the best light absorption enhancement for the IR photodetectors at the wavelength we concern.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

For a further understanding of the nature, objects, and advantages of the present disclosure, reference should be had to the following detailed description, read in conjunction with the following drawings, wherein like reference numerals denote like elements and wherein.

DETAILED DESCRIPTION

Figure 1:
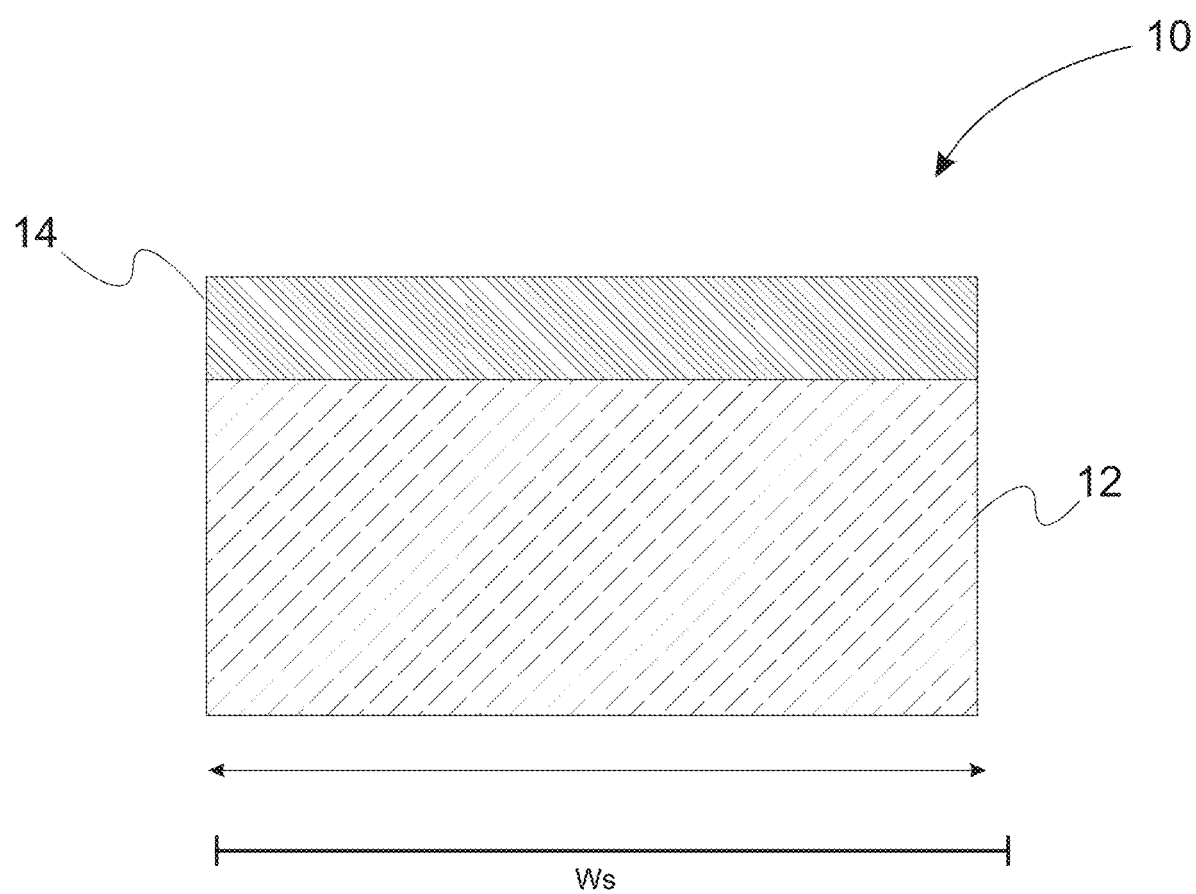
FIG. 1 is a schematic illustration describing a semiconductor-based sensor, and in particular, a CMOS light sensor.

Reference will now be made in detail to presently preferred compositions, embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

With respect to the terms "comprising," "consisting of," and "consisting essentially of," where one of these three terms is used herein, the presently disclosed and claimed subject matter can include the use of either of the other two terms.

The phrase "composed of" means "including" or "consisting of." Typically, this phrase is used to denote that an object is formed from a material.

The term "one or more" means "at least one" and the term "at least one" means "one or more." The terms "one or more" and "at least one" include "plurality" as a subset.

The term "substantially," "generally," or "about" may be used herein to describe disclosed or claimed embodiments. The term "substantially" may modify a value or relative characteristic disclosed or claimed in the present disclosure. In such instances, "substantially" may signify that the value or relative characteristic it modifies is within ±0%, 0.1%, 0.5%, 1%, 2%, 3%, 4%, 5% or 10% of the value or relative characteristic.

It should also be appreciated that integer ranges explicitly include all intervening integers. For example, the integer range 1-10 explicitly includes 1, 2, 3, 4, 5, 6, 7, 8, 9, and 10. Similarly, the range 1 to 100 includes 1, 2, 3, 4 . . . 97, 98, 99, 100. Similarly, when any range is called for, intervening numbers that are increments of the difference between the upper limit and the lower limit divided by 10 can be taken as alternative upper or lower limits. For example, if the range is 1.1. to 2.1 the following numbers 1.2, 1.3, 1.4, 1.5, 1.6, 1.7, 1.8, 1.9, and 2.0 can be selected as lower or upper limits.

In the examples set forth herein, concentrations, temperature, and reaction conditions (e.g., pressure, pH, flow rates, etc.) can be practiced with plus or minus 50 percent of the values indicated rounded to or truncated to two significant figures of the value provided in the examples. In a refinement, concentrations, temperature, and reaction conditions (e.g., pressure, pH, flow rates, etc.) can be practiced with plus or minus 30 percent of the values indicated rounded to or truncated to two significant figures of the value provided in the examples. In another refinement, concentrations, temperature, and reaction conditions (e.g., pressure, pH, flow rates, etc.) can be practiced with plus or minus 10 percent of the values indicated rounded to or truncated to two significant figures of the value provided in the examples.

The computer implemented processes and methods disclosed herein can be deliverable to/implemented by a processing device, controller, or computer, which can include any existing programmable electronic control unit or dedicated electronic control unit. Similarly, the computer implemented processes and methods can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The computer implemented processes and methods can also be implemented in a software executable object. Alternatively, the computer implemented processes and methods can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

Throughout this application, where publications are referenced, the disclosures of these publications in their entireties are hereby incorporated by reference into this application to more fully describe the state of the art to which this invention pertains.

Abbreviations

"FDTD" means finite-difference time-domain method.
"IR" means infrared.
"PDMS" means polydimethylsiloxane.
"PML" means perfectly matched layer.
"RCWA" means rigorous coupled-wave analysis.
"NIL" means nanoimprint lithography.
"MEEP" refers to a free finite-difference time-domain simulation software package developed at MIT to model electromagnetic systems.

The term "low-κ dielectric" refers to material with a small relative dielectric constant (κ, kappa) relative to silicon dioxide.

The term "high-κ dielectric" refers to a material with a high dielectric constant (κ, kappa) compared to silicon dioxide.

In a refinement, the term "optimize" means that a set of adjustable design parameters for a patterned spatially inhomogeneous dielectric layer are adjusted by an optimization method to increase light absorption in a semiconductor light sensor element as compared to light absorption in the semiconductor light sensor element without the patterned spatially inhomogeneous dielectric layer. In a further refinement, the term "optimize" means that a set of adjustable design parameters for patterned spatially inhomogeneous dielectric layer are adjusted by an optimization method to provide a maximally attainable light absorption in a semiconductor light sensor element as compared to light absorption in the semiconductor light sensor element without the patterned spatially inhomogeneous dielectric layer.

With reference to FIG. 1, a schematic illustration describing an optimized semiconductor-based sensor with enhanced light absorption is provided. Light sensor 10 includes semiconductor light sensor element 12 and patterned spatially inhomogeneous dielectric layer 14. Typically, semiconductor light sensor element 12 includes a photoactive component that converts photons into currents. The photoactive component can be a p-n junction, p-i-n junction, a metal-semiconductor-metal photodetector element, a phototransistor element, and the like. In a particularly useful variation, the semiconductor-based sensor is a silicon-based sensor with the silicon light sensor element 12 (e.g., with p-n junction or p-i-n junction) In a refinement, the semiconductor light sensor element 12 is a CMOS light sensor element. Typically, semiconductor-based sensor 10 and patterned spatially inhomogeneous dielectric 14 each independently has a width Ws along direction $d_1$ and length Ls along direction $d_2$, which is perpendicular to $d_1$ from about 1 micron to 10 microns. In a refinement, semiconductor-based sensor 10 and patterned spatially inhomogeneous dielectric 14 each independently have a width and length from about 3 microns to 7 microns Patterned spatially inhomogeneous dielectric layer 14 is disposed over semiconductor light sensor element 12. In a refinement, patterned spatially inhomogeneous dielectric layer 14 has a refractive index that varies as a function of position within the layer. Characteristically, the spatial inhomogeneity of the patterned spatially inhomogeneous dielectric layer is optimized to provide a maximized electric field in the semiconductor light sensor such that light absorption is enhanced. In particular, patterned spatially inhomogeneous dielectric layer 14 is a metasurface layer that can be formed by photolithography. Advantageously, patterned spatially inhomogeneous dielectric layer 14 is designed to enhance the intensity of the electric field within semiconductor light sensor element 12 by enhancing the resonant modes within the semiconductor light sensor element 12. Characteristically, the light incident on light sensor 10 has a wavelength in the visible (i.e., 380 nm to 740 nm) or near-infrared regions of the electromagnetic spectrum (i.e., 780 nm to 2500 nm). Therefore, the incident light can have a wavelength from 380 nm to 2500 nm. One wavelength that has been analyzed is 850 nm. In a refinement, the patterned spatially inhomogeneous dielectric layer 14 is deposited directly onto the semiconductor light sensor element 12. However, it should be appreciated that the semiconductor light sensor element 12 may have another optically transparent protective layer onto which the semiconductor light sensor element 12 is deposited. Such a transparent protective layer must be sufficiently thin so as not to interfere with the absorption enhancement provided by the patterned spatially inhomogeneous dielectric layer 14.

Figure 2A:
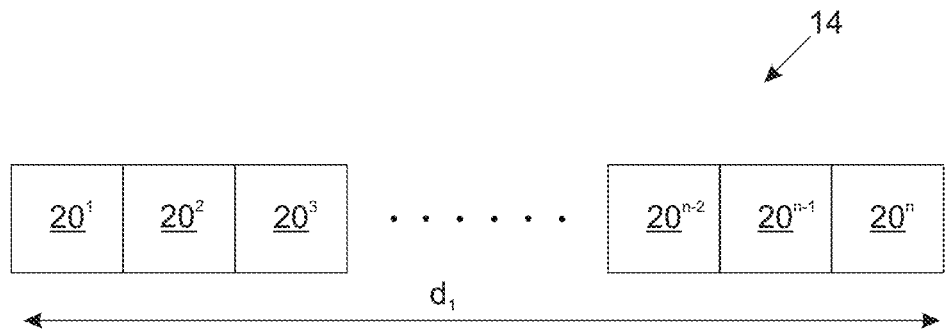
FIG. 2A provides a cross-section showing a model for a patterned spatially inhomogeneous dielectric layer that includes a plurality of cells.
Figure 2B:
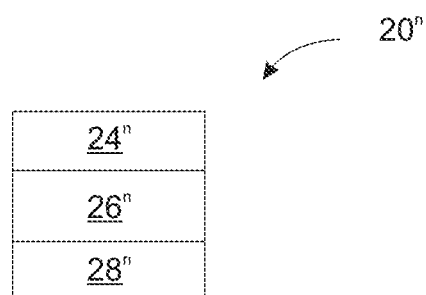
FIG. 2B provides a cross-section of a cell having one or more sublayers.
Figure 2C:
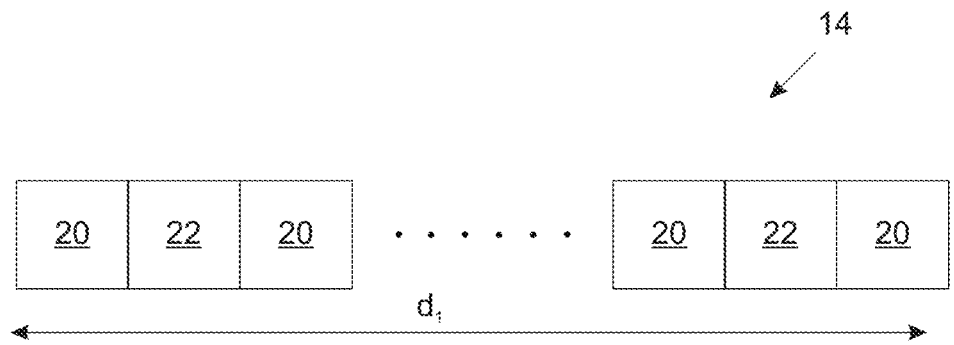
FIG. 2C provides a cross-section showing a model for a patterned spatially inhomogeneous dielectric layer that includes a plurality of cells having an alternating structure.

The semiconductor-based sensor, and in particular, the patterned spatially inhomogeneous dielectric layer is designed and constructed by simulating an amount absorbed by the semiconductor-based sensor by a simulation method and optimizing the plurality of adjustable design parameters by an optimization method to enhance light absorption in the semiconductor light sensor element and to form a set of optimized design parameters. FIG. 2A provides a cross-section showing a model for the patterned spatially inhomogeneous dielectric layer 14. In this variation, patterned spatially inhomogeneous dielectric layer 14 is modeled as an array of cells 20n. In a refinement, subsets of cells 20n will have a different refractive index. For example, a subset of the cells can be an air gap while other cells are composed of one or more dielectric sublayers 22n, 24n, and 26n as depicted in FIG. 2B. In this figure, n is an integer label running from 1 to nmax, where nmax is the maximum number of n for the d1 direction at a cross-section thereof. In a refinement, a subset of the cells 20n are a high-κ dielectric. Examples of such high k dielectrics include, but are not limited to, hafnium silicate, zirconium silicate, hafnium dioxide, zirconium dioxide, and combinations thereof. In a further refinement, a subset of the cells 20 can be a low k-dielectric. Examples of low k-dielectrics include but are not limited to, porous silicon dioxide, porous organosilicate glasses, spin-on organic polymeric dielectrics, and air. Therefore, a first subset of the cells can be composed of a high dielectric material, while a second subset of the cells can be composed of a low dielectric material. In some refinements, a subset of the cells are composed of silicon dioxide or include a sublayer of silicon dioxide. In still other refinement, array of cells 20n includes cells that are air, a dielectric material, or sublayers of the dielectric material. FIG. 2C provides an example in which cells 20 composed of a first composition alternate along direction d1 with cells 22 composed second composition. Typically, the cells of FIGS. 2A, 2B, and 2C are nanostructures having at least one dimension from about 50 to 500 nm. In a variation, the patterned spatially inhomogeneous dielectric layer 14 include an array of cells 20n in which a first subset of the array of cells includes cells that have a first refractive index and a second subset of the array of cells includes cells that have a second refractive index. Advantageously, spatial inhomogeneity of the patterned spatially inhomogeneous dielectric layer is optimized with respect to a set of adjustable design parameters to increase light absorption in the semiconductor light sensor element as compared to light absorption in the semiconductor light sensor element without the patterned spatially inhomogeneous dielectric layer with the set of adjustable design parameters including cell lengths, cell widths, and optional cell lengths.

Figure 3A:
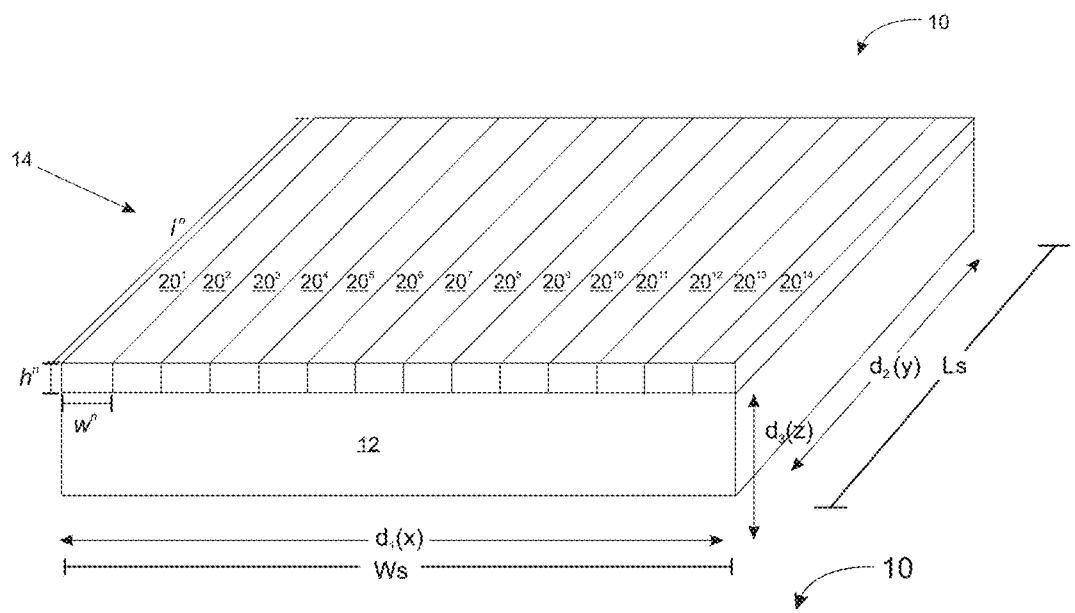
FIG. 3A provides an illustration in which metasurface cells are rectangular columns extending across the surface of the semiconductor light sensor element.
Figure 3B:
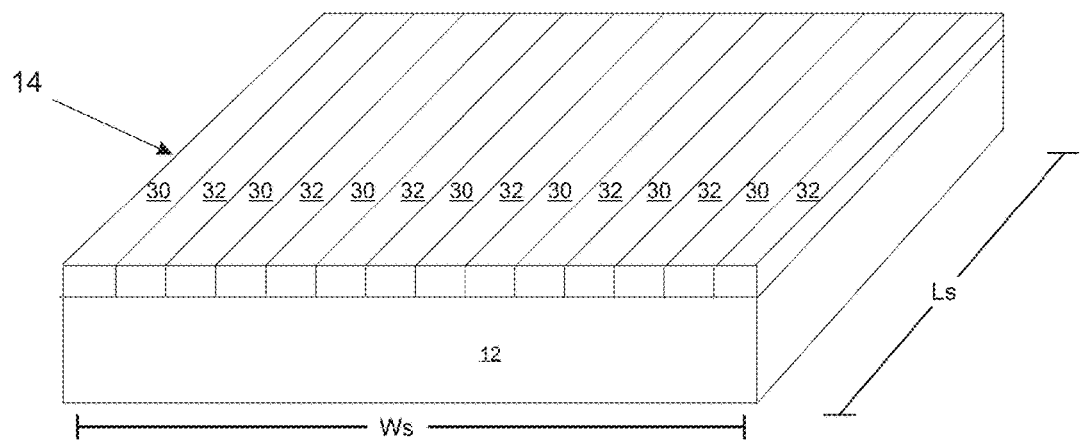
FIG. 3B provides an illustration in which metasurface cells are alternating rectangular columns extending across the surface of the semiconductor light sensor element.

FIG. 3A provides an illustration in which cells $20^n$ are rectangular columns extending across the surface of semiconductor light sensor element 12 along directions $d_1$ and $d_2$, which are perpendicular to each other. Each cell $20^n$ can be defined by a width $w^n$, a length $l^n$, and a height $h^n$ along directions $d_1$, $d_2$, and $d_3$, respectively. Directions $d_1$, $d_2$, and $d_3$ define a cartesian coordinate system that can apply coordinates x, y, and z as is conventionally used. As set forth above, a subset of the cells $20^n$ are a high k dielectric. In a further refinement, a subset of the cells 20 can be a low k-dielectric. In some refinements, a subset of the cells are composed of silicon dioxide or include a sublayer of silicon dioxide. In still another refinement, array of cells $20^n$ includes cells that are air, a dielectric material or sublayers of the dielectric material. In a variation, the patterned spatially inhomogeneous dielectric layer 14 include an array of cells $20^n$ in which a first subset of the array of cells includes cells that have a first refractive index and a second subset of the array of cells includes cells that have a second refractive index. Advantageously, spatial inhomogeneity of the patterned spatially inhomogeneous dielectric layer is optimized with respect to a set of adjustable design parameters to increase light absorption in the semiconductor light sensor element as compared to light absorption in the semiconductor light sensor element without the patterned spatially inhomogeneous dielectric layer with the set of adjustable design parameters including cell lengths and cell widths. The optimizations and simulations set forth below indicate that a useful range for the height $h^n$ is from about 300 nm to about 1 micron and the width $w_n$ from about 50 nm to about 300 nm. In some refinements, the height $h_n$ is at least about 200 nm, 300 nm, 400 nm, or 500 nm and at most in increasing order of preference, 1 micron, 900 nm, 800 nm, 750 nm, or 700 nm. In some refinements, the width $w^n$ is at least about 25 nm, 50 nm, 100 nm, or 200 nm and at most, in increasing order of preference, 550 nm, 500 nm, 350 nm, or 300 nm. For columns, the length $l^n$ can be somewhat arbitrarily chosen and can be from about 0.5 microns to 10 microns. The present variation is suitable when the incident light is polarized. FIG. 3B provides an example of the design of FIG. 3A. FIG. 3A is which columns 30 are composed of a first composition alternate with columns 32 composed of a second composition. The variations of FIGS. 3A-3B are particularly suitable when the incident light is unpolarized.

Figure 4A:
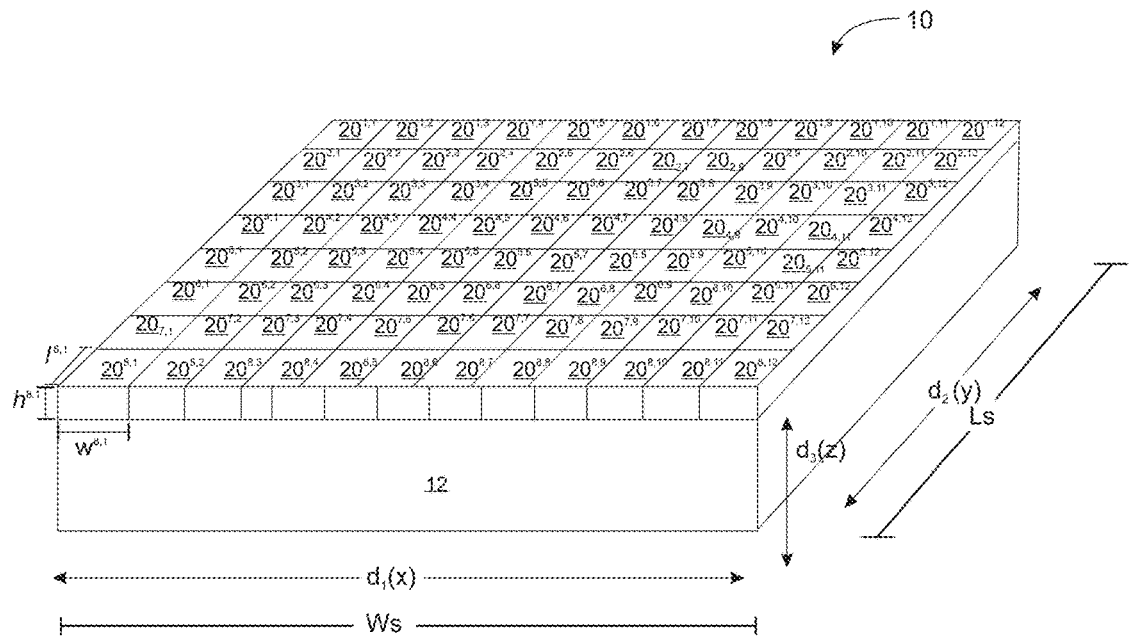
FIG. 4A provides an illustration in which metasurface cells are discrete objects that are arranged along each direction of the surface of the semiconductor light sensor element.
Figure 4B:
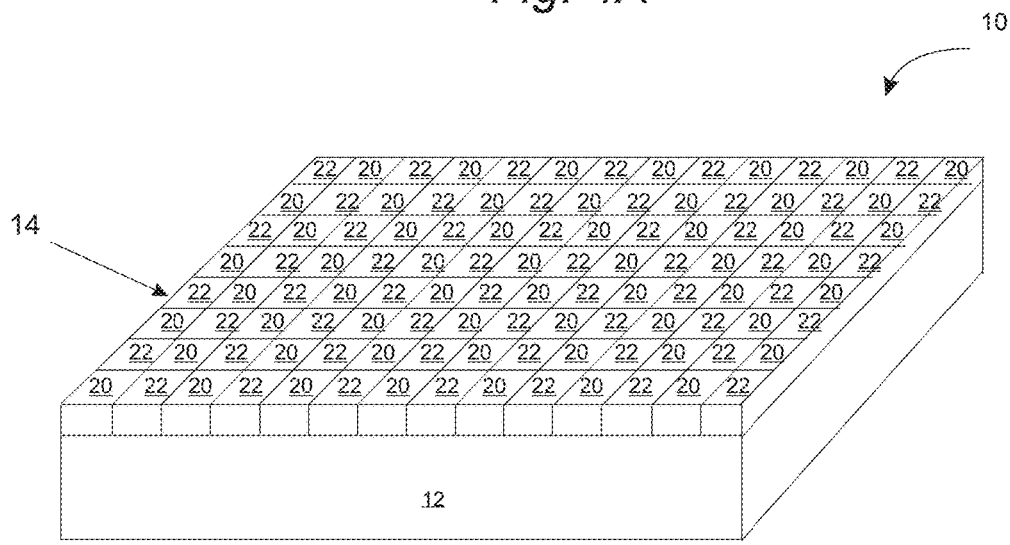
FIG. 4B provides an illustration in which metasurface cells are discrete objects that alternate along each direction of the surface of the semiconductor light sensor element.

FIG. 4A provides an illustration in which cells $20^{n,m}$ are discrete objects (e.g., geometric solids) arranged along directions $d_1$ and $d_2$ of the surface of semiconductor light sensor element 12. Typically, the discrete objects are arranged in an array that is periodic in one or both of directions $d_1$ and $d_2$. Therefore, the array of cells can include cells that are discrete objects that alternate along each direction of a surface of the semiconductor light sensor element. In FIG. 4A, n and m are integer labels for cells $20^{n,m}$ running from 1 to $n_{max}$ and 1 to mmax, respectively. Moreover, n is a label for cells along direction $d_1$ and $n_{max}$ is maximum value for n in the $d_1$ direction. Similarly, m is label for cells along direction $d_2$ and mmax is the maximum value for m in the $d_2$ direction. The discrete objections that define cells $20^{n,m}$ can be geometric 3D solids such as cubes, trapezoidal prisms (i.e., a geometric prism), pyramids, parallelepiped, cones, cylinder, tetrahedron, and the like. Typically, cells $20^{n,m}$ are formed from a dielectric material, layers of dielectric materials, or air gaps. In a refinement, a subset of the cells $20^{n,m}$ are a high k dielectric. In a further refinement, a subset of the cells $20^{n,m}$ can be a low k-dielectric. Therefore, a first subset of the cells can be composed of a high dielectric material, while a second subset of the cells can be composed of a low dielectric material. In some refinements, a subset of the cells are composed of silicon dioxide or include a sublayer of silicon dioxide. In still other refinement, cells $20^{n,m}$ includes cells that are air, a dielectric material or sublayers of the dielectric material. FIG. 4B provides an example of the design of FIG. 4A is which cells 20 are composed of a first composition alternate with cells 22 composed of a second composition. It should be appreciated that each of the cells 20 and 22 can be formed of different dielectric materials, i.e., not every cell 20 need be formed from the same material and not every cell 22 need be formed from the same material. In a variation, the patterned spatially inhomogeneous dielectric layer 14 include an array of cells $20^{n,m}$ in which a first subset of the array of cells includes cells that have a first refractive index and a second subset of the array of cells includes cells that have a second refractive index. Advantageously, spatial inhomogeneity of the patterned spatially inhomogeneous dielectric layer is optimized with respect to a set of adjustable design parameters to increase light absorption in the semiconductor light sensor element as compared to light absorption in the semiconductor light sensor element without the patterned spatially inhomogeneous dielectric layer with the set of adjustable design parameters including cell lengths and cell widths.

The optimizations and simulations set forth below indicate that a useful range for the height $h^{n,m}$ is from about 300 nm to about 1 micron and the width $w^{n,m}$ from about 50 nm to about 300 nm. In some refinements, the height $h^{n,m}$ is at least about 200 nm, 300 nm, 400 nm, or 500 nm, and at most in increasing order of preference, 1 micron, 900 nm, 800 nm, 750 nm, or 700 nm. In some refinements, the width $w^{n,m}$ is at least about 25 nm, 50 nm, 100 nm, or 200 nm, and at most, in increasing order of preference, 550 nm, 500 nm, 350 nm, or 300 nm. In this variation, the length $l^{n,m}$ is somewhat arbitrary but is typically from about 50 nm to about 300 nm.

In some refinements, the length $l^{n,m}$ is at least about 25 nm, 50 nm, 100 nm, or 200 nm, and at most, in increasing order of preference, 550 nm, 500 nm, 350 nm, or 300 nm. The optimizations and simulations set forth below indicate that a useful range for the height $h_n$ is from about 300 nm to about 1 micron and the width $w_n$ from about 50 nm to about 300 nm. In some refinements, the height $h_n$ is at least about 200 nm, 300 nm, 400 nm, or 500 nm, and at most in increasing order of preference, 1 micron, 900 nm, 800 nm, 750 nm, or 700 nm. In some refinements, the width $w_n$ is at least about 25 nm, 50 nm, 100 nm, or 200 nm, and at most, in increasing order of preference, 550 nm, 500 nm, 350 nm, or 300 nm. For columns, the length $h_n$ can be somewhat arbitrarily chosen. This variation is suitable when the incident light is polarized. FIG. 3B provides an example of the design of FIG. 3A in which columns 30 are composed of a first composition alternate and columns 32 are composed of a second composition. The variations of FIGS. 3A-3B are particularly suitable when the incident light is unpolarized. In a further refinement, a subset of the cells 22 are simply air gaps disposed between cells 20 of a high k-dielectric.

In a variation, an optimization method is combined with simulation to design the patterned spatially inhomogeneous dielectric layer, and in particular, to design the metasurface. In one refinement, the simulation method is a finite-difference time-domain method. In another variation, the simulation method is a rigorous coupled-wave analysis method. In should be appreciated that another number of optimization methods can be used to obtain the set of optimized design parameters. In one refinement, the optimization is a global optimization method. Examples of global optimization methods include stochastic optimization methods, particle swarm optimization methods, genetic optimization methods, Monte-Carlo optimization methods, gradient-assisted optimization method, simulated annealing optimization methods, pattern search optimization methods, a Multi start methods, and the like A particularly useful optimization method is particle swarm optimization. In the particle swarm optimization method, potential solutions referred to as particles, flies (i.e., moves within) in a multi-dimensional search space with a velocity. The velocity is dynamically adjusted according to the flying experience of the particle and other particles. In a basic method for the particle swarm method, an objection function $f(p_i)$ is optimized where $p_i$ is the vector of particle positions. For the present invention, the objective function is the amount of incident light absorbed by the semiconductor light sensor element or another measure thereof. The particle's position is initialized with a uniformly distributed random vector $x_i$ which is set between upper and lower limits. The particle's best know position $p_i$ is initialized to the initial position vector $x_i$. If f(pi) is less than f(g) then the swarm's best-known position g is updated with pi. Initialize the particle's velocity vi is initialized with a velocity value between predetermined upper and lower velocity limits. This iteration loop starts as follows. While the termination criteria is not met, the particle velocity $v_{i,d}$ for each particle and each dimension d is updated by $\omega \cdot v_{i,d} + \varphi_p \cdot r_p \cdot (p_{i,d} - x_{i,d}) + \varphi_g \cdot r_g \cdot (g_d - x_{i,d})$ where $v_{i,d}$ is the velocity of the $i^{th}$ particle in the d dimension, $r_p$, $r_g$ are random numbers between 0 and 1, $p_{i,d}$ is the $i^{th}$ particle's best known position in the d dimension, $x_{i,d}$ is the $i^{th}$ particle's position in the d dimension, $g_d$ is the particle's best position vector in the d dimension. The particle's position $x_i$ is updated by $x_i + lr \cdot vi$ where lr is a predetermined learning rate between 0 and 1. If f(xi)<f(pi) then the particle's best known position pi is updated with xi. If $f(p_i)$<f(g), then update the swarm's best-known g is updated with position pi. The method then returns to the iteration loop start until the stop criteria is met. The stop condition can be the execution of a predetermined number of iterations or when the absorption reaches a predetermined value.

Advantageously, the metasurface is fabricated over the semiconductor light sensor element with the plurality of adjustable design parameters set to values that are within a predetermined percentage of the optimized design parameters. In a refinement, the plurality of adjustable design parameters set to values that are within 20% of the optimized design parameters. In other refinements, the plurality of adjustable design parameters set to values that are within, in increasing order of preference 20%, 15%, 10%, 5%, 1% or 0%, of the optimized design parameters. As set forth above, the patterned spatially inhomogeneous dielectric layer is modeled as an array of cells, each of which can have a different refractive index. In this model, the plurality of adjustable design parameters include cell height, cell width, and cell gap between adjacent cells. In a further refinement, the plurality of adjustable design parameters includes the refractive index of each cell. In one refinement, the cells are rectangular columns extending across the surface of the semiconductor light sensor element. In another refinement, the array of cells includes cells that are discrete objects that alternate along each direction of a surface of the semiconductor light sensor element.

Figure 5A:
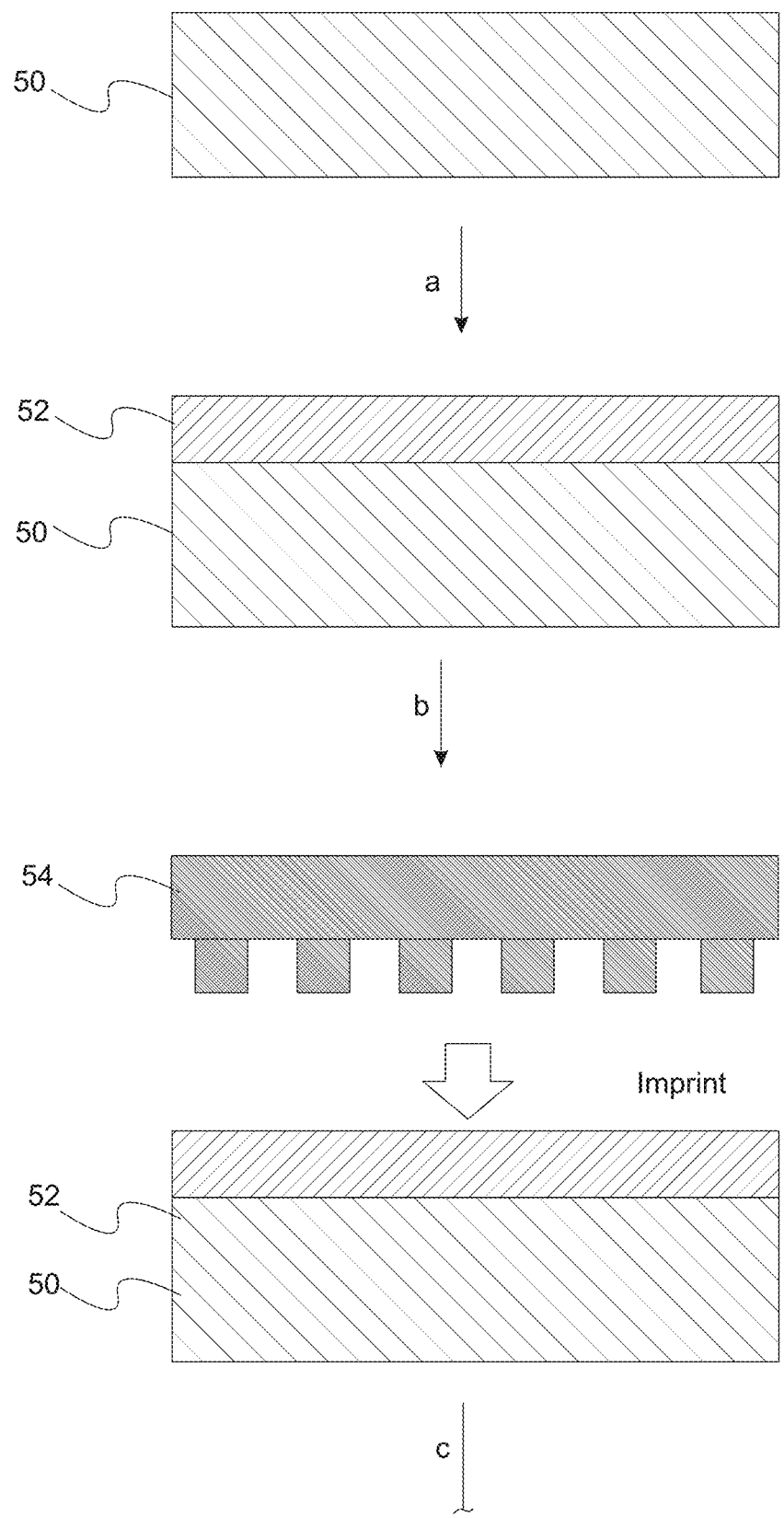
FIGS. 5A, 5B, and 5C provide a schematic flowchart illustrating a method for making the patterned spatially inhomogeneous dielectric layers.
Figure 5B:
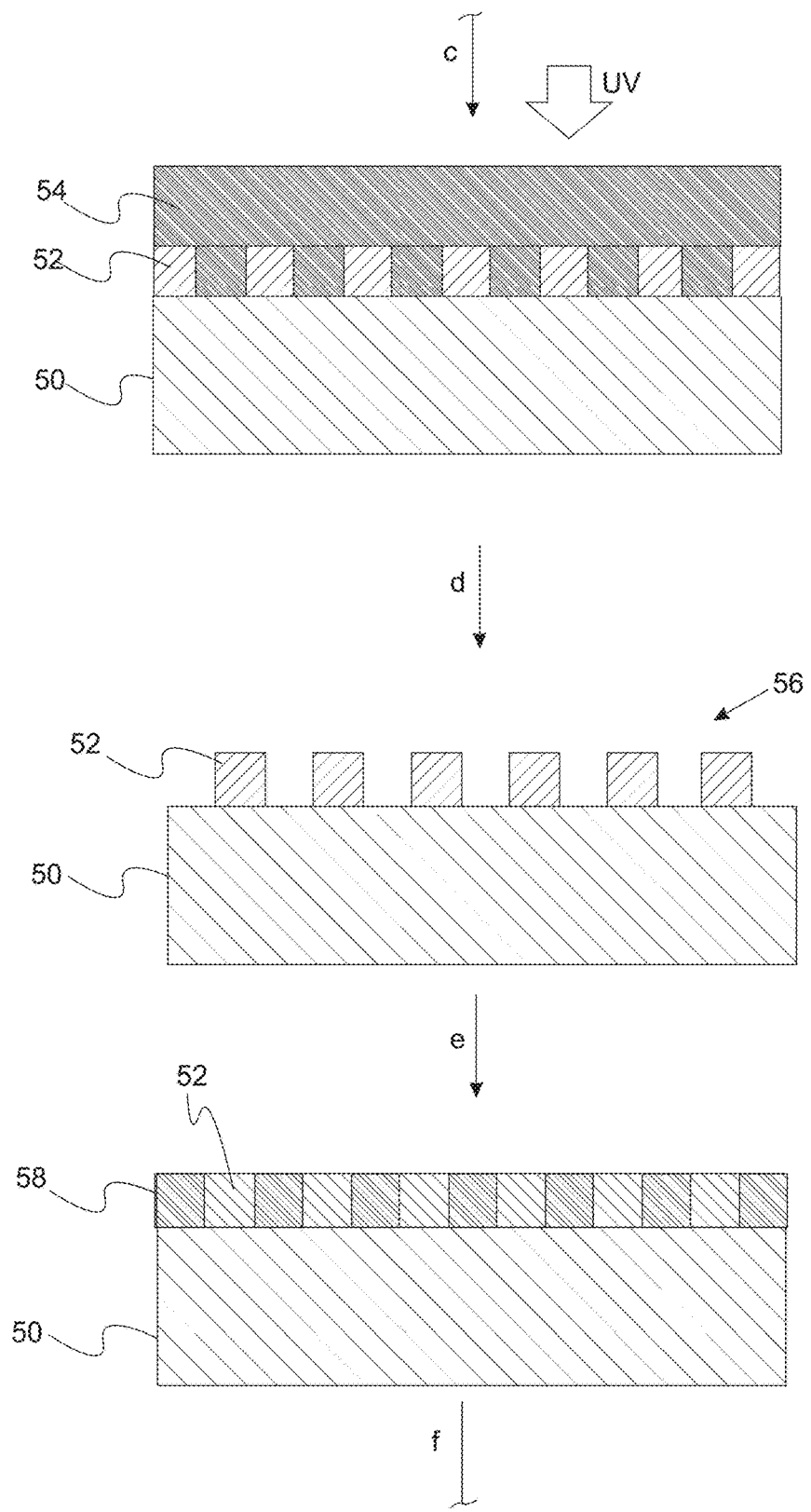
Figure 5C:
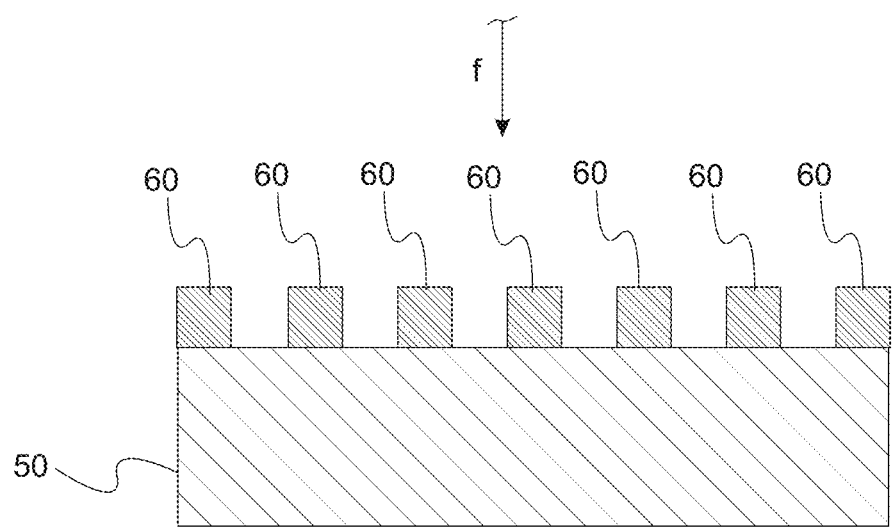

Referring to FIGS. 5A, 5B, and 5C, a schematic flow chart of a method of fabricating the metasurface is provided. In step a), a spin-coated UV resist 52 deposited on top of the semiconductor device 50 (e.g., the semiconductor substrate). In step b), the spin-coated UV resist 52 is nanoimprinted with mold 54 to define a pattern for the cells. Mold 54 is composed of a UV transparent material (e.g., fused silica or PDMS) and can be formed by interference lithography or e-beam lithography. In step c), UV light is used to cure the UV resist. In step d), a dry etch is applied to remove the residual UV resist on the surface of the semiconductor device (i.e., the semiconductor light sensor element), leaving behind resist pattern 56. In step e), dielectric materials 58 are deposited in the gaps defined by resist pattern 56. In step f), the UV resist is removed to reveal cells 60 composed of the dielectric material 58.

In another embodiment, a method for enhancing the light absorption of a semiconductor-based sensor is provided. Referring to FIG. 1, semiconductor-based sensor 10 includes a patterned spatially inhomogeneous dielectric layer 14 disposed over a semiconductor light sensor element 12. Characteristically, the patterned spatially inhomogeneous dielectric layer is defined by a plurality of adjustable design parameters. The method incudes a step of receiving a set of optimized design parameters determined by simulating an amount absorbed by semiconductor-based sensor by a simulation method and optimizing the plurality of adjustable design parameters by an optimization method to enhance light absorption in the semiconductor light sensor element to form the set of optimized design parameters. The patterned spatially inhomogeneous dielectric layer is fabricated over the semiconductor light sensor element with the plurality of adjustable design parameters set to values that are within 20 percent of optimized design parameters in the set of optimized design parameters. In some refinements, the plurality of adjustable design parameters are set to values that are within 20 percent, 10 percent, 5 percent, 2 percent, or 1 percent of corresponding values in the set of optimized design parameters. Details for the semiconductor-based sensor 10, semiconductor light sensor element 12, and patterned spatially inhomogeneous dielectric layer 14 are set forth above.

Figure 6:
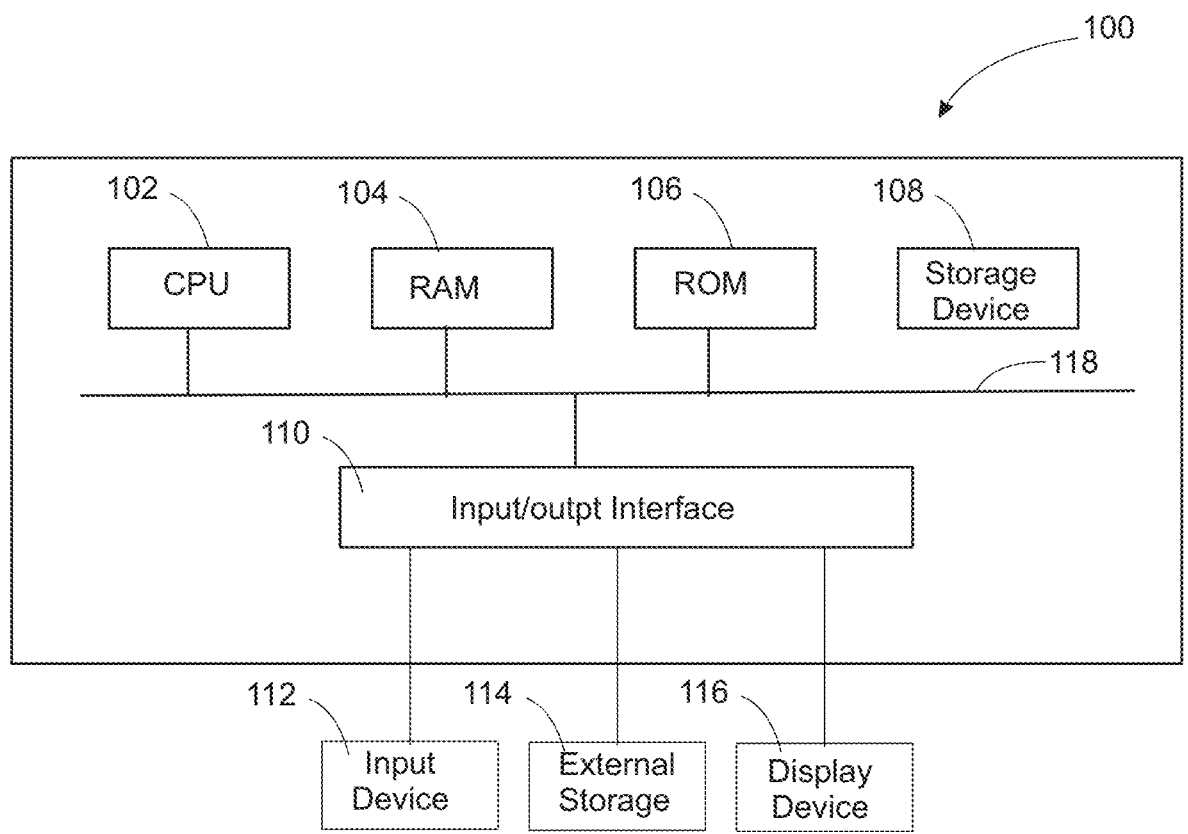
FIG. 6 is a block diagram of a computing system that can be used to implement the simulation and optimization methods and to calculate the optimized parameters.

The methods set forth herein implementing the simulation and optimization methods to calculate the set of optimized parameters can be implemented by specialized hardware design for that purpose. More commonly, these steps can be implemented by a computer program executing on a computing device. FIG. 6 provides a block diagram of a computing system that can be used to implement the simulation and optimization methods and to calculate the optimized parameters. Computing system 100 includes a processing unit 102 that executes the computer-readable instructions for the executable simulation and optimization methods to calculate the set of optimized parameters. Processing unit 102 can include one or more central processing units (CPU) or microprocessing units (MPU). Computer system 100 also includes RAM 104 or ROM 106 that can have instructions encoded thereon for the simulation and optimization methods. Computer system 100 can also include a secondary storage device 108, such as a hard drive. Input/output interface 110 allows interaction of computing device 100 with an input device 112 such as a keyboard and mouse, external storage 114 (e.g., DVDs and CDROMs), and a display device 116 (e.g., a monitor). Processing unit 102, the RAM 104, the ROM 106, the secondary storage device 108, and input/output interface 110 are in electrical communication with (e.g., connected to) bus 118. During operation, computer system 100 reads computer-executable instructions (e.g., one or more programs) recorded on a non-transitory computer-readable storage medium which can be secondary storage device 108 and or external storage 114. Processing unit 102 executes these reads computer-executable instructions for the simulation and optimization methods to calculate the set of optimized parameters set forth above. Specific examples of non-transitory computer-readable storage medium for which executable instructions of the optimization and simulation methods are encoded onto include but are not limited to, a hard disk, RAM, ROM, an optical disk (e.g., compact disc, DVD), or Blu-ray Disc (BD)™), a flash memory device, a memory card, and the like.

The following examples illustrate the various embodiments of the present invention. Those skilled in the art will recognize many variations that are within the spirit of the present invention and scope of the claims.

Figure 7:
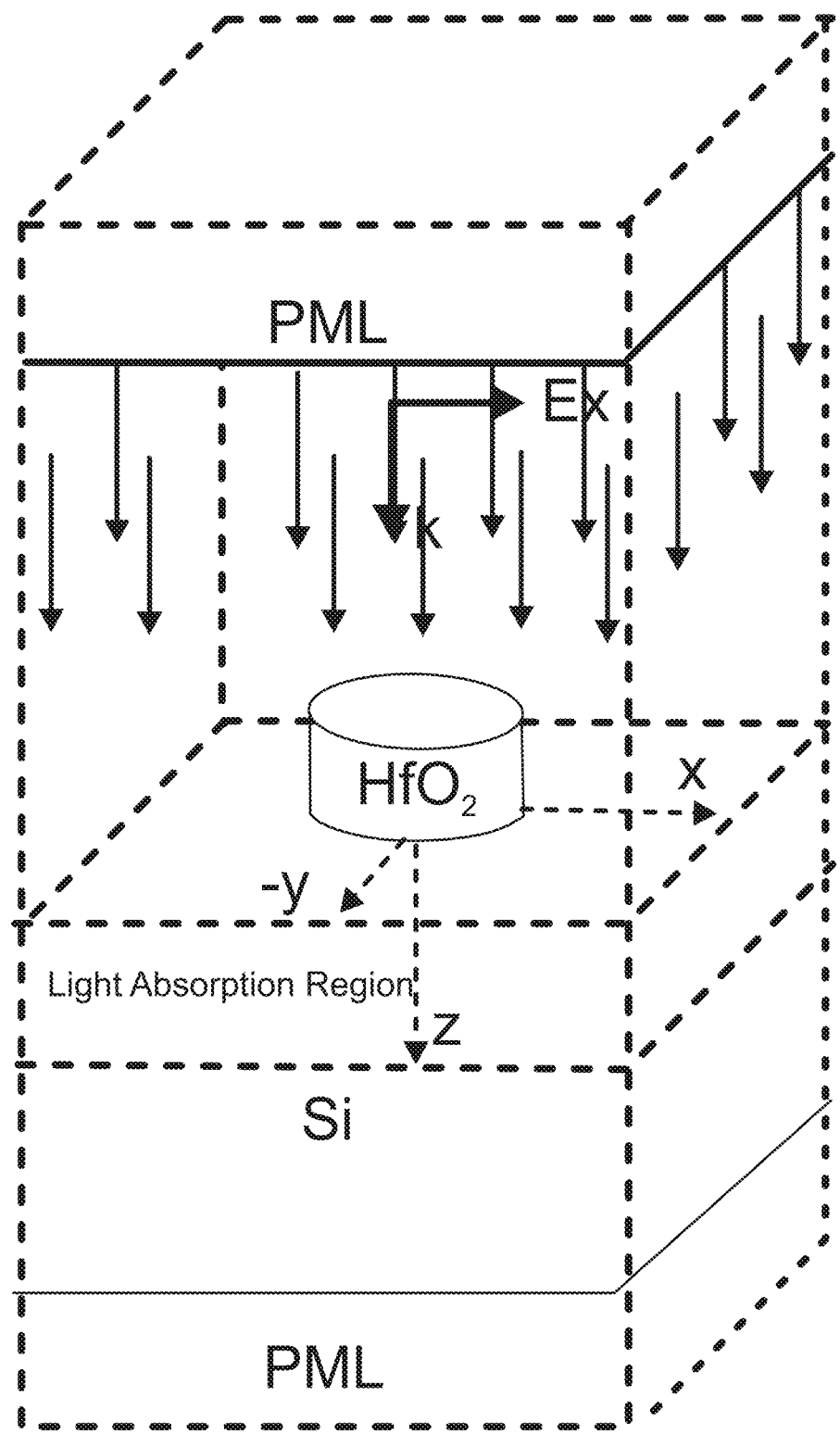
FIG. 7 is a schematic of a simulation cell used in the simulation and optimization analysis.

All numerical simulations were carried out using the finite difference time domain (FDTD) method. FIG. 7 provides a schematic of a simulation cell used in the analysis is provided. When designing the metasurfaces, a perfectly matched layer (PML) boundary condition is used in the z-direction and the periodic boundary conditions in the x-direction. Therefore the calculation of absorption was performed in an array configuration. The metasurfaces were assumed infinite in the y-direction. In our electromagnetic calculations, we assumed that the incoming light impinged normally on the metasurface. That is, the incoming electromagnetic wave propagated along the z-direction. It should be appreciated that a disk structure can provide the same light absorption enhancement in different light polarizations. In x-z plane when applying a grating structure with infinite length along the y-direction, only the electric filed with x direction polarization can enhance the light absorption of semiconductor light sensors. If a disk structure is used, the light absorption of semiconductor light sensors can be enhanced regardless the light polarization since the symmetric property of disk in horizontal plane and can interact with any light polarization.

Figure 8:
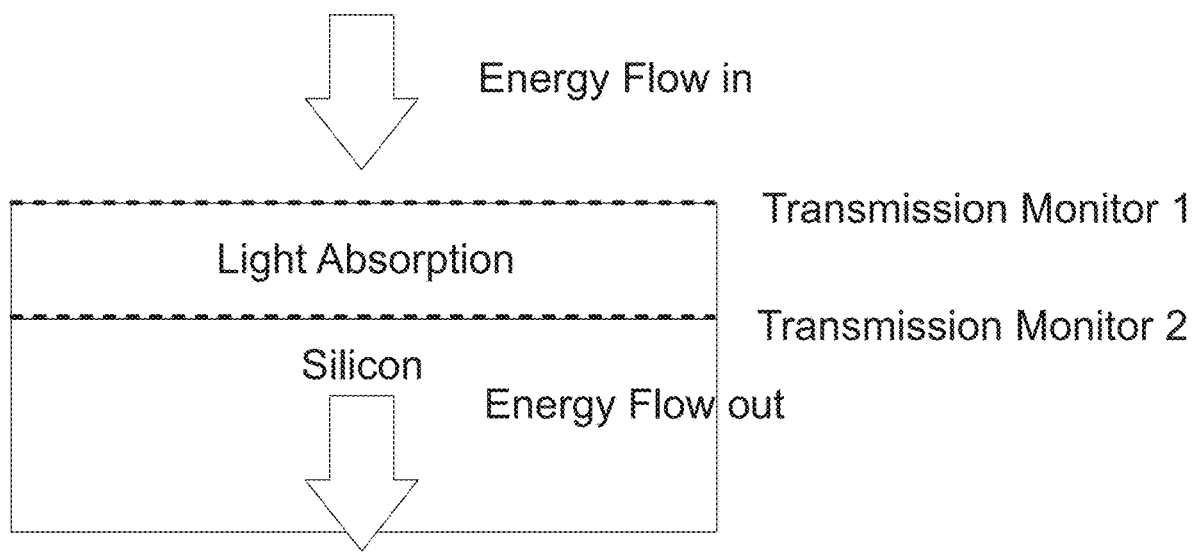
FIG. 8 is a schematic illustrating the calculation of energy loss in a simulated region.

FIG. 8 illustrates that the light absorption can be calculated by (1) integral the energy loss inside the region of interest or (2) subtracting the transmitted power that flow in to the transmitted power that flow out to the simulation region. The relative permittivity of silicon is: $\epsilon_1=13.220$; $\epsilon_2=0.025165$. At fixed frequency MEEP allows the loss due to $\epsilon_2$ to be approximated to the loss due to the conductivity. The refractive index of hafnium dioxide ($HfO_2$) at 850 nm is: n=2.0893. The refractive index of hafnium dioxide ($HfO_2$) at 850 nm is: n=2.0893. The refractive index of silicon nitride ($Si_3N_4$) at 850 nm is: n=2.021. The refractive index of titanium dioxide ($TiO_2$) at 850 nm is: n=2.5086. The refractive index of silicon dioxide ($SiO_2$) at 850 nm is: n=1.4525. The spatial step that used in each simulation depends on the medium used in the simulation. The spatial step need to be smaller than the wavelength of the medium that having the highest refractive index divided by 10 to ensure the simulation result is accurate.

Example 1

Figures 9A, 9B:
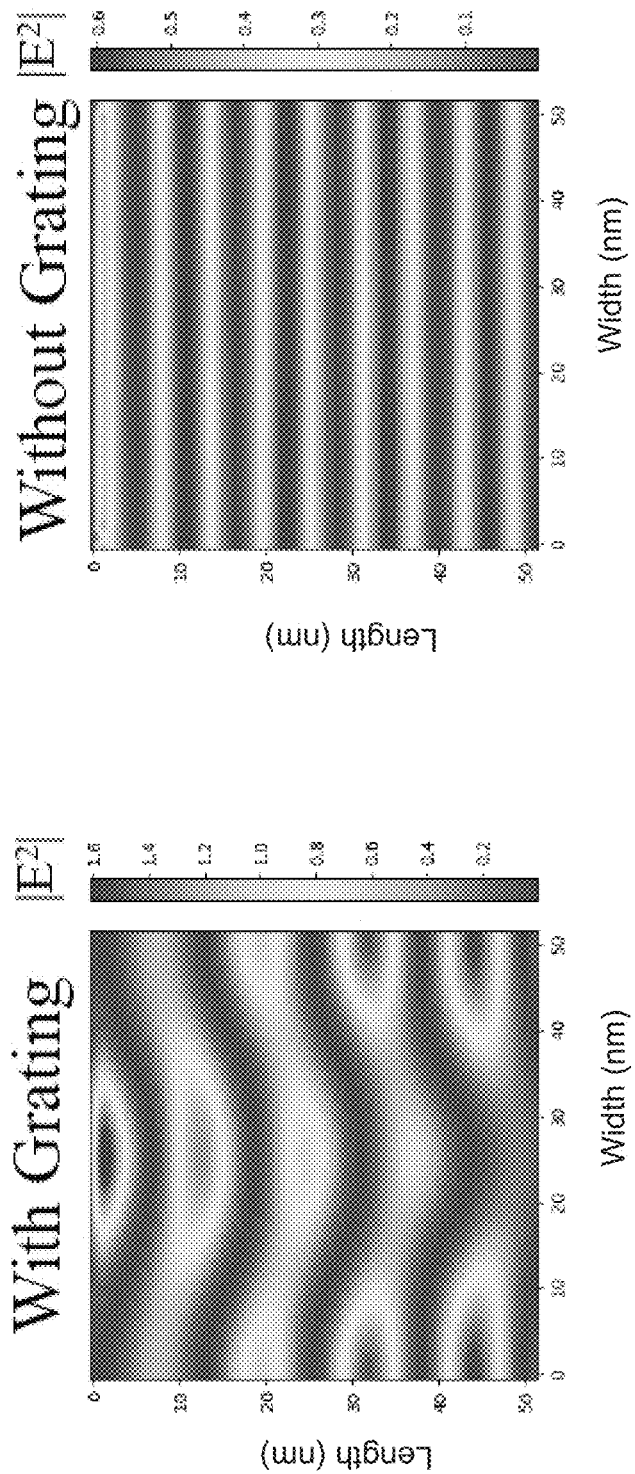
FIGS. 9A and 9B are plots of the normalized light absorption with (A) and without (B) a grating composed of a metasurface.

In this examples, a grating composed of a high dielectric rectangular object alternating with an air gap disposed over a silicon substrate was modelled. After using 30 particles and 30 iteration times in a swarm optimization, the results were:
Height: 0.73956778 μm
Width: 0.29996134 μm
Gap: 0.22808477 μm
The increase of iteration times will ensure that the optimized result obtained is the global optimized result. FIG. 9 provides plots of the normalized light absorption with and without the grating.

Example 2

Figure 10:
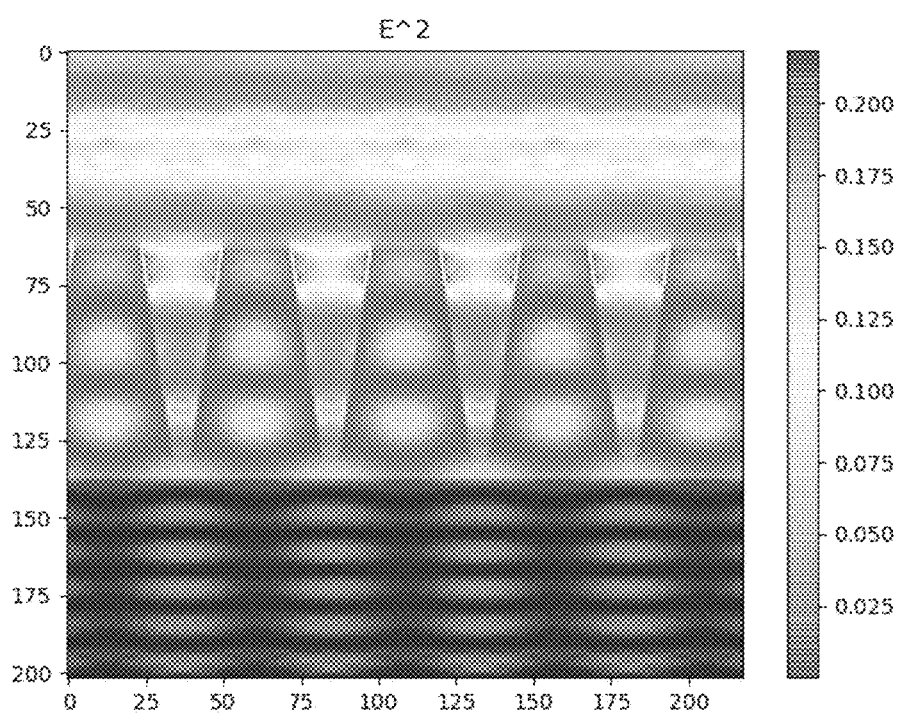
FIG. 10 provides plots of the normalized light intensity in the vicinity of the grating and substrate.

In this example, a grating composed of $HfO_2$ 1-D trapezoid grating periodically alternating with an air gap disposed over a silicon substrate was modelled. After using 30 particles and 30 iteration times in a swarm optimization, the results were:
Grating Height=0.74
Top grating width=0.22
Bottom grating width=0.45
Gap distance between each trapezoid=0.13
The observed enhancement factor over a case without the grating is 1.28. FIG. 10 provides plots of the normalized light intensity in the vicinity of the grating and substrate.

Example 3

Figure 11A:
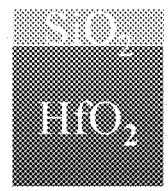
FIG. 11A is a cross-section of a 1-D $SiO_2/HfO_2$ rectangular used in a grating thereof.
Figure 11B:
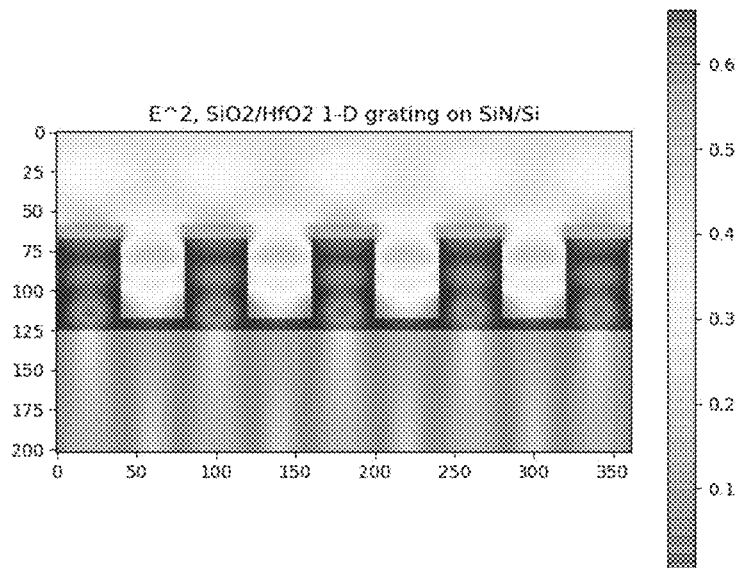
FIG. 11B provides plots of the normalized light intensity in the vicinity of the grating formed by the rectangles of FIG. 10A and substrate.
Figure 11C:
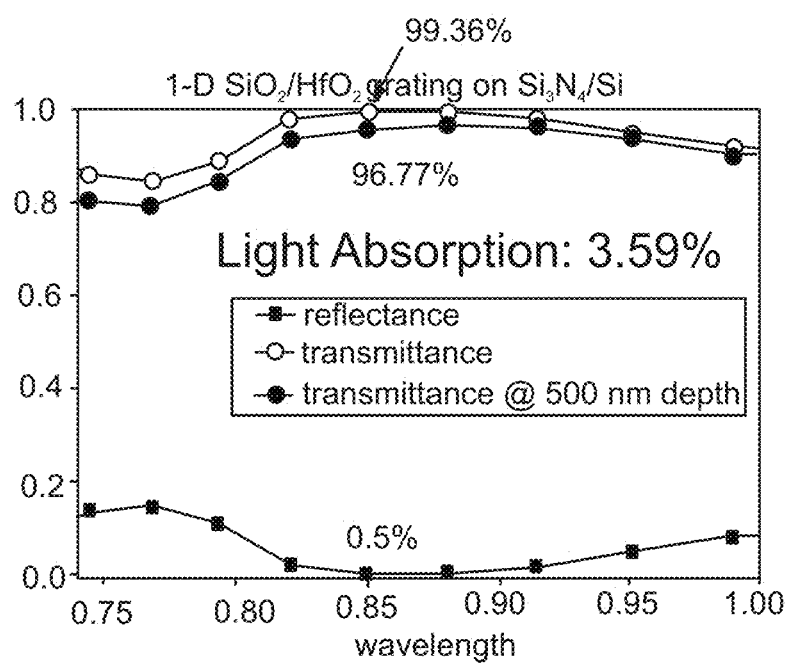
FIG. 11C provides plots of the reflectance, transmittance, and transmittance at a 500 nm depth in the substrate grating formed by the rectangles of FIG. 10A.

In this example, a grating composed of 1-D $SiO_2/HfO_2$ rectangular (FIG. 11A) grating periodically alternating with an air gap disposed over a silicon substrate was modelled. After using 30 particles and 30 iteration times in a swarm optimization, the results were:
$HfO_2$: Height: 500 nm,
Width: 400 nm, and Gap: 200 nm
$SiO_2$: thickness: 90 nm.
The enhancement factor was about 1.23. FIG. 11B provides plots of the normalized light intensity in the vicinity of the grating and substrate. FIG. 11C provides plots of the reflectance, transmittance, and transmittance at a 500 nm depth in the substrate.

Example 4

Figure 12A:
FIG. 12A is a cross-section of a 1-D $SiO_2/HfO_2/TiO_2$ rectangular used in a grating thereof.

In this example, a grating composed of 1-D SiO$_2$/HfO$_2$/TiO$_2$ rectangular (FIG. 12A) grating periodically alternating with an air gap disposed over a silicon substrate was modelled. After using 30 particles and 30 iteration times in a swarm optimization, the results were:

SiO$_2$: 60 nm.
HfO$_2$: thickness: 100 nm.
TiO$_2$ thickness: 300 nm.
The width of grating width: 600 nm.
Gap: 100 nm.

Figure 12B:
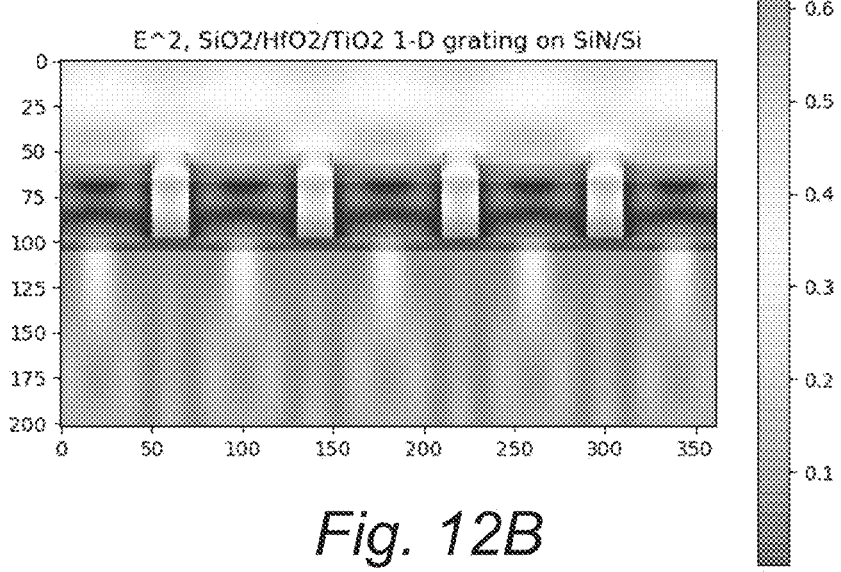
FIG. 12B provides plots of the normalized light intensity in the vicinity of the grating formed by the rectangles of FIG. 11A and substrate.
Figure 12C:
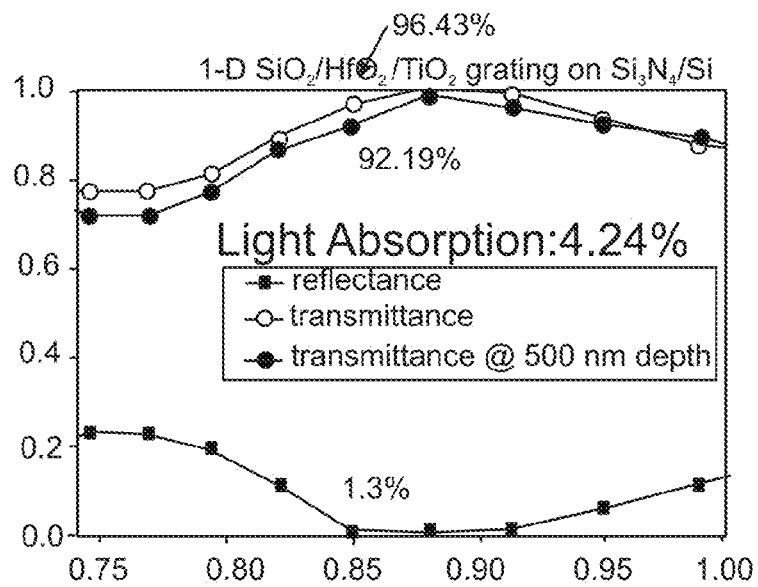
FIG. 12C provides plots of the reflectance, transmittance, and transmittance at a 500 nm depth in the substrate grating formed by the rectangles of FIG. 11A.

The enhancement factor was about 1.46. FIG. 12B provides plots of the normalized light intensity in the vicinity of the grating and substrate. FIG. 12C provides plots of the reflectance, transmittance, and transmittance at a 500 nm depth in the substrate.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method for enhancing light absorption of a semiconductor-based sensor comprising patterned spatially inhomogeneous dielectric layer disposed over a semiconductor light sensor element, wherein the patterned spatially inhomogeneous dielectric layer is defined by a plurality of adjustable design parameters, the method comprising:
   receiving a set of optimized design parameters determined by:
      simulating an amount absorbed by the semiconductor-based sensor by a simulation method; and
      optimizing the plurality of adjustable design parameters by an optimization method to enhance light absorption in the semiconductor light sensor element to form the set of optimized design parameters; and
   fabricating the patterned spatially inhomogeneous dielectric layer over the semiconductor light sensor element with the plurality of adjustable design parameters set to values that are within 20 percent of optimized design parameters in the set of optimized design parameters, wherein the patterned spatially inhomogeneous dielectric layer includes cells that include 2 or 3 sublayers.

2. The method of claim 1 wherein the simulation method is a finite-difference time-domain method.

3. The method of claim 1 wherein the simulation method is a rigorous coupled-wave analysis method.

4. The method of claim 1 wherein the optimization method is a particle swarm optimization.

5. The method of claim 1 wherein the patterned spatially inhomogeneous dielectric layer is modeled as an array of cells, each of which can have a different refractive index.

6. The method of claim 5 wherein the plurality of adjustable design parameters includes cell height, cell width, and cell gap between adjacent cells.

7. The method of claim 5 wherein the plurality of adjustable design parameters includes the refractive index of each cell.

8. The method of claim 5 wherein the array of cells includes cells that are rectangular columns extending across a surface of the semiconductor light sensor element.

9. The method of claim 5 wherein the array of cells includes cells that are discrete objects that alternate along each direction of a surface of the semiconductor light sensor element.

10. The method of claim 5 wherein the array of cells includes cells that are air, a dielectric material or sublayers of the dielectric material.

11. The method of claim 10 wherein a first subset of the array of cells includes cells that are a high k dielectric.

12. The method of claim 11 wherein the high k dielectric is selected from the group consisting of hafnium silicate, zirconium silicate, hafnium dioxide, zirconium dioxide, and combinations thereof.

13. The method of claim 11 wherein a second subset of the array of cells includes cells that are air gaps disposed between cells of a high k-dielectric.

14. An optimized semiconductor-based sensor made by the method of claim 1.

* * * * *